United States Patent
Froggatt et al.

(12) United States Patent (10) Patent No.: US 6,426,496 B1
(45) Date of Patent: Jul. 30, 2002

(54) HIGH PRECISION WAVELENGTH MONITOR FOR TUNABLE LASER SYSTEMS

(75) Inventors: Mark E. Froggatt, Blacksburg; Brooks A. Childers, Gloucester, both of VA (US)

(73) Assignee: The United States of America as represented by the Administrator of the National Aeronautics and Space Administration, Washington, DC (US)

( * ) Notice: Subject to any disclaimer, the term of this patent is extended or adjusted under 35 U.S.C. 154(b) by 48 days.

(21) Appl. No.: 09/648,529

(22) Filed: Aug. 22, 2000

(51) Int. Cl.[7] .................................................. G01J 4/00
(52) U.S. Cl. .............................. 250/227.18; 250/227.23
(58) Field of Search ..................... 250/227.18, 227.23, 250/227.19, 227.27; 372/12, 23, 28, 32; 356/460, 477

(56) References Cited

U.S. PATENT DOCUMENTS 5,289,256 A    2/1994  Gramling ................... 356/345
5,982,791 A  * 11/1999  Sorin et al. .................. 372/25

FOREIGN PATENT DOCUMENTS

EP    0 479 118 A2    9/1991
EP    1 028 503 A2    1/2000
FR    2701 563 A1    2/1993

* cited by examiner

*Primary Examiner*—Que T. Le
(74) *Attorney, Agent, or Firm*—Helen M. Galus (57) ABSTRACT

A solid-state apparatus for tracking the wavelength of a laser emission has a power splitter that divides the laser emission into at least three equal components. Differing phase shifts are detected and processed to track variations of the laser emission.

20 Claims, 7 Drawing Sheets

HIGH PRECISION WAVELENGTH MONITOR FOR TUNABLE LASER SYSTEMS

STATEMENT REGARDING FEDERALLY SPONSORED RESEARCH OR DEVELOPMENT

The invention described herein may be manufactured and used by or for the government of the United States of America for governmental purposes without the payment of any royalties thereon or therefor.

BACKGROUND OF THE INVENTION

1. Field of the Invention

The present invention relates to a solid-state apparatus for tracking the wavelength of a laser emission. More particularly, the apparatus uses a 3×3 coupler to determine the frequency shift of the laser emission.

2. Brief Description of the Related Art

Currently available tunable lasers can cover hundreds of nanometers of continuous tuning on the 1550 nm communications wavelength band. Knowing the precise wavelength at any given time can be extremely difficult. Typically, this measurement has been achieved using a Fizeau wavemeter. These instruments are effective, but they require careful alignment and sophisticated processing of the optical signals.

U.S. Pat. No. 5,798,521 to Froggatt discloses a long Michelson interferometer, constructed from fiber-optic devices, that provides an excellent means of measuring small changes in wavelength to a very high degree of precision. This patent, however, does not determine the direction of the wavelength change, and, as a result would fail if the tuning direction changed. Although most laser sweeps are monotonic, the required retrace, and the drift in wavelength while the laser is not being tuned are not necessarily monotonic.

SUMMARY OF THE INVENTION

The present invention includes a solid-state apparatus for tracking the wavelength of a laser emission comprising a guided wave directional coupler having at least three inputs and three outputs constituting channels, wherein any phase shift induced between the channels is substantially unaffected by changes in the wavelength over the intended range of operation, means for passing a portion of a laser emission through two substantially different path lengths, wherein the laser emission exiting from the two substantially different path lengths are recombined using the directional coupler, means for detecting the power level in at least two of the outputs of the directional coupler and means for determining the direction and magnitude of laser emission wavelength changes from changes in the at least two detected power levels.

The present invention further comprises a method for tracking laser emissions, comprising the steps of providing a solid-state apparatus for tracking the wavelength of a laser emission having a guided wave directional coupler having at least three inputs and three outputs constituting channels, wherein any phase shift induced between the channels is substantially unaffected by changes in the wavelength over the intended range of operation, means for passing a portion of a laser emission through two substantially different path lengths, wherein the laser emission exiting from the two substantially different path lengths are recombined using the directional coupler, means for detecting the power level in at least two of the outputs of the directional coupler and means for determining the direction and magnitude of laser emission wavelength changes from changes in the at least two detected power levels, initiating a laser emission into the apparatus, splitting the laser emission into differing phase shifts and processing the phase shifts sufficient to track the laser emissions.

Additionally, the present invention includes a tracked laser emission product by the process comprising the steps of providing a solid-state apparatus for tracking the wavelength of a laser emission having a guided wave directional coupler having at least three inputs and three outputs constituting channels, wherein any phase shift induced between the channels is substantially unaffected by changes in the wavelength over the intended range of operation, means for passing a portion of a laser emission through two substantially different path lengths, wherein the laser emission exiting from the two substantially different path lengths are recombined using the directional coupler, means for detecting the power level in at least two of the outputs of the directional coupler and means for determining the direction and magnitude of laser emission wavelength changes from changes in the at least two detected power levels, initiating a laser emission into the apparatus, splitting the laser emission into differing phase shifts, processing the phase shifts sufficient to track the laser emissions and calibrating the laser emission.

The present invention is particularly suited for using a 3×3 coupler, and detecting a wavelength change to a precision of from about 0.1 $\mu$m or less.

DETAILED DESCRIPTION OF THE PREFERRED EMBODIMENT

The present invention comprises a solid-state, fiber-optic, alignment free apparatus, and method for using the apparatus, for tracking the wavelength of a continuously tunable, mode-hop-free laser. This is accomplished without the need of microprocessors or software. The change in wavelength from some user-defined start wavelength can be read as a large digital integer. Multiplication by a constant will yield the wavelength change to a precision of 0.1 $\mu$m or better.

Figure 1:
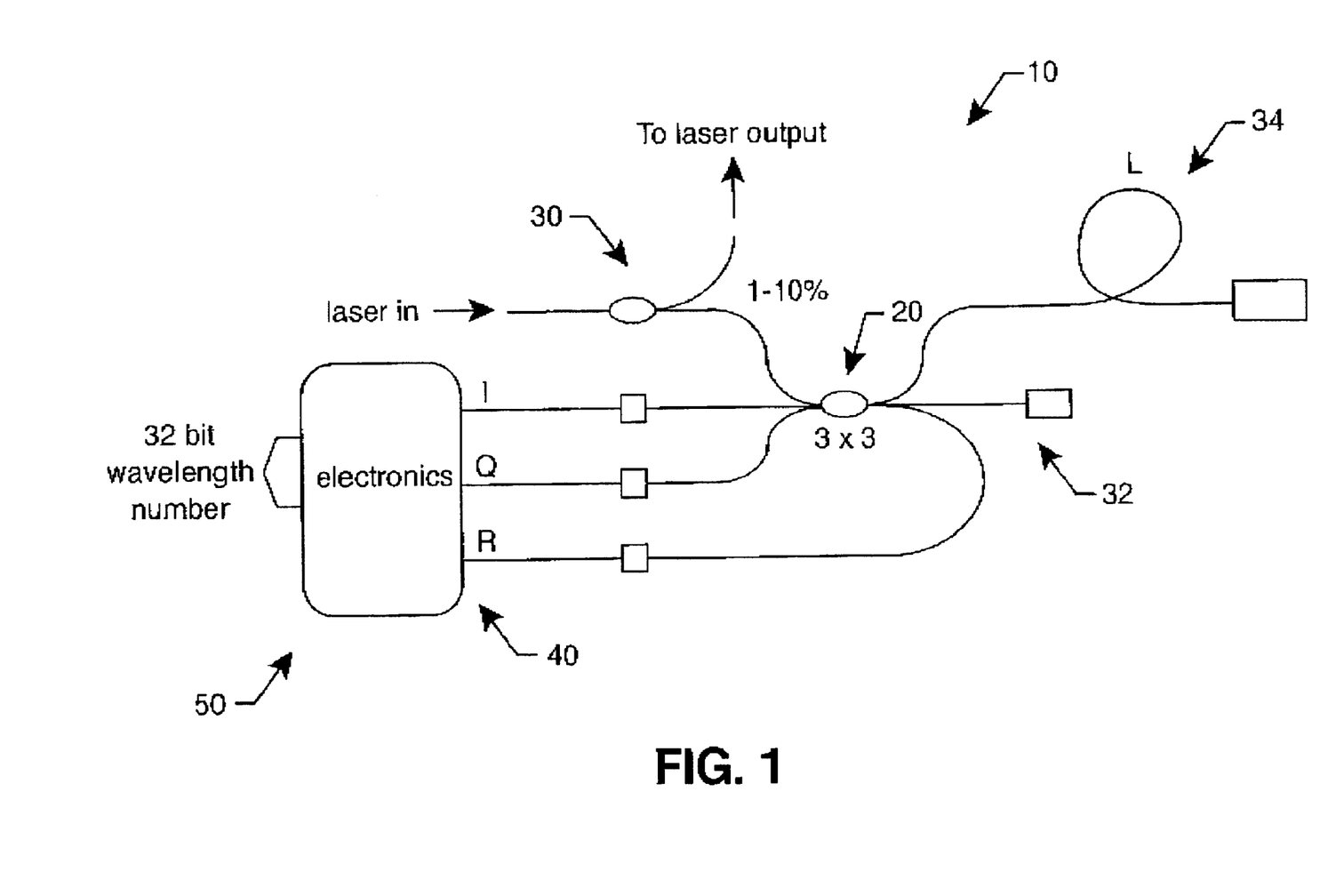
FIG. 1 shows a schematic of a digital all-fiber wavelength monitor the tracking apparatus of the present invention.

As seen in FIG. 1, the solid-state tracking apparatus 10 of the present invention includes a guided wave directional coupler 20, means for passing a portion of a laser emission 30, means for detecting the power 40 and means for determining the direction and magnitude of laser emission wavelength changes 50.

The guided wave directional coupler 20 comprises at least three inputs and three outputs, such as a 3×3 coupler or 4×4 coupler, with the inputs and outputs forming paths or channels therein. Higher connection count couplers may be used provided they are produced using a single fused region and are not produced by "treeing" together different couplers. The selection of the proper directional coupler 20 is determinable by those skilled in the art, such as Gould part number 23-40355-33-01201 manufactured by Gould Fiberoptics Division of Gould Electronics of Baltimore, Md. A single fused region of the directional coupler 20 ensures a stable phase difference between channels with respect to wavelength and temperature. Phase shifts induced between these channels remain sufficiently pronounced to be substantially unaffected by changes in the wavelength over the intended range of operation, which preferably ranges from about 1520 nm to about 1570 nm, commonly referred to as the "C-band".

The means for passing a portion of a laser emission 30 includes passing a portion of the laser emission through two substantially different path lengths, a shorter path length 32 and a longer path length 34, with the difference between the two path lengths 32 and 34 being (L). After passage of the laser emission through the two path lengths 32 and 34, the light from the two path lengths is recombined using the directional coupler 20. Proper selection of appropriate means for passing a portion of a laser emission 30 is determinable by those skilled in the art. An example of the means for passing a portion of a laser emission 30 includes the Model 6428 or Model 6328 External cavity diode laser manufactured by NewFocus of Santa Clara, Calif.

The means for detecting the power 40 measures at least two of the outputs of the directional coupler 20. The means for detecting the power 40 may comprise a Thorlabs PDA400 optical detector manufactured by Thorlabs of Newton, N.J., or other suitable detector as determinable by those skilled in the art. The means for determining the direction and magnitude of laser emission wavelength changes 50 uses changes in the detected power levels, with proper selection determinable by those skilled in the art in light of the disclosure herein.

With the introduction of a laser emission into the solid-state tracking apparatus 10, from about 1% to about 10% of the laser is fed into the 3×3 directional coupler 20. Two out of phase signals can be obtained from a long unbalanced Michelson Interferometer formed by the 3×3 coupler 20 and the two Faraday Rotator mirrors. An example of the Faraday Rotator mirrors includes Isowave part no. I15SFRM, manufactured by Isowave of Dover, N.J.

The 3×3 coupler 20 can provide a 120 degree phase shift between the interference fringes incident on the I and Q detectors. A 4×4 coupler 20 can provide a 90 degree phase shift between the interference fringes incident on the I and Q detectors. The presence of a phase shifted signal, other than a phase shift of 180 degrees, permits the assessment of the direction of the wavelength change.

Figure 2:
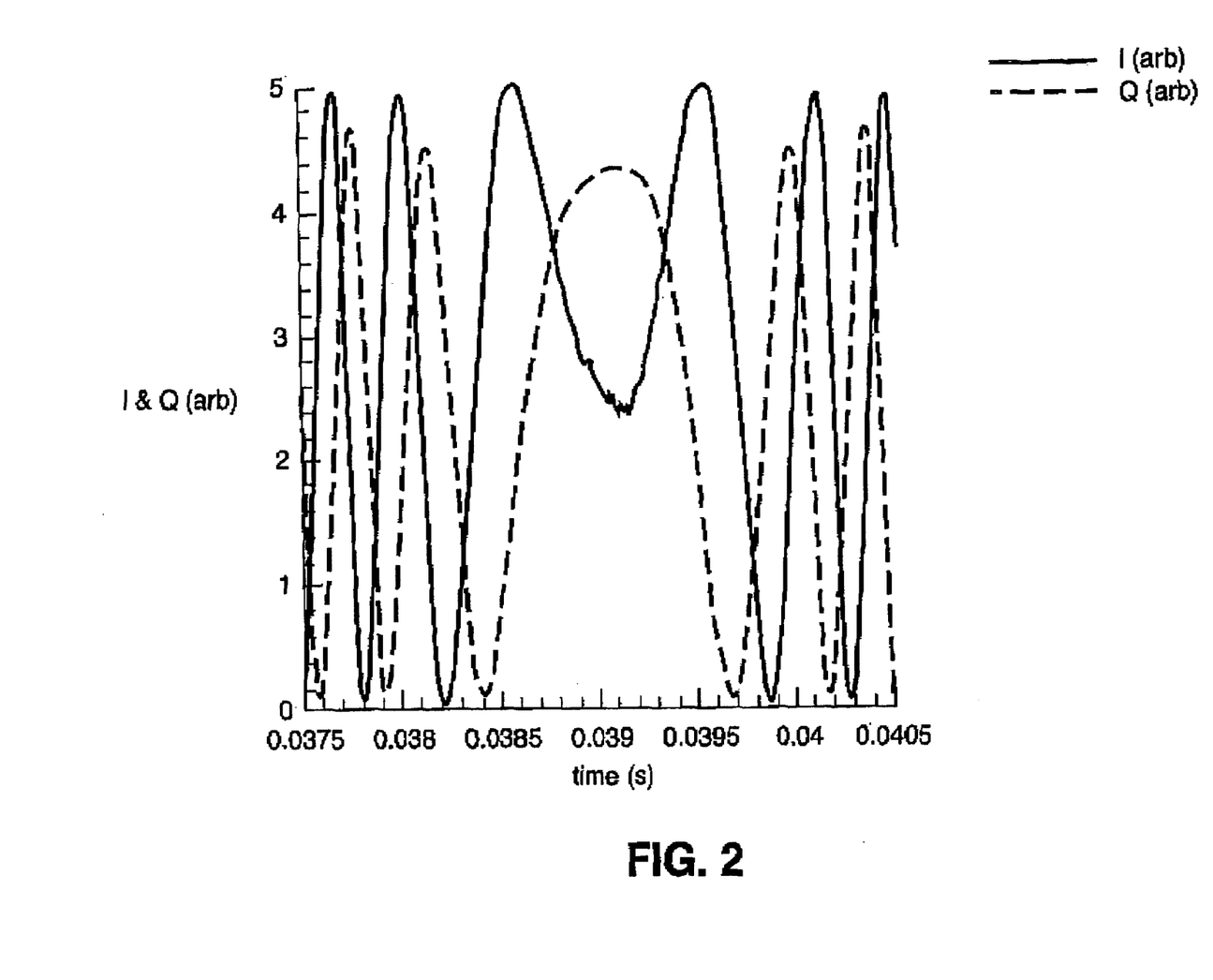
FIG. 2 illustrates signals measured at I and Q.

As seen in FIG. 2, the two signals, I and Q, are plotted as a sinusoidal wavelength modulation. The two signals are shown over the region where the tuning slows, from about 0.0375 seconds to about 0.0385 seconds, where I leads Q and then changes direction, at a time of approximately 0.039 seconds, where I lags Q. The change in from I leading Q to I lagging Q is apparent and signals the change in the direction of the sweep.

Figure 3:
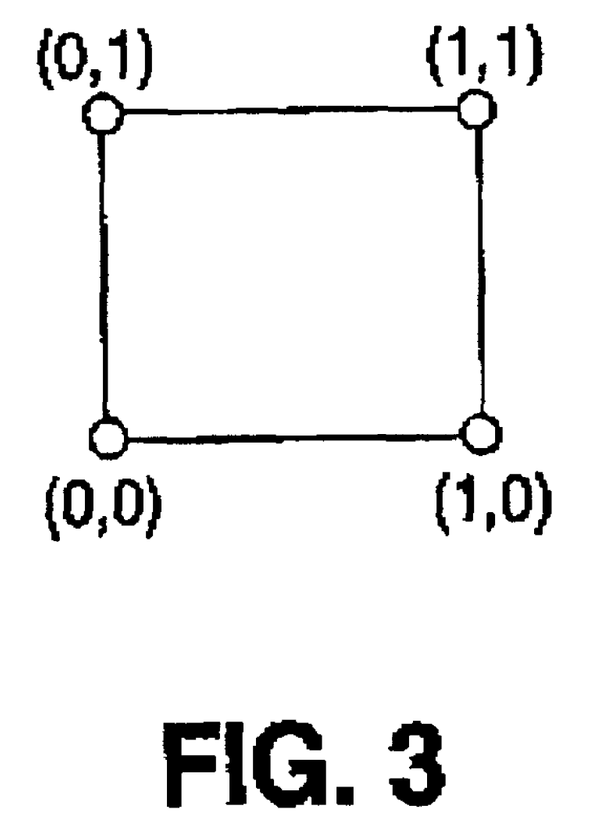
FIG. 3 is a graphical representation of the possible states of the I-Q system.

With reference to FIG. 3, by changing the sinusoidal wavelength modulation signals into digital signals, an I-Q system may be created. By placing a threshold around the center of their total excursion, the I may be plotted on one axis, such as the x-axis, with the Q plotted on a second axis, such as the y-axis. As such, a defined square becomes generated, confined, for example, with the parameters of (0,0), (0,1),(1,1), (1,0). This graphical representation shows the possible states of the I-Q system, i.e., I and Q are equal (reversing) at (0,0) and (1,1), I is leading (1,0) or Q is leading (0,1). With the signals out of phase, transitions across the diagonals of the square, i.e., (0,0) to (1,1) or (0,1) to (1,0), are prohibited. As such, any changes in state occur with progression between adjacent comers, ie., (0,0) to either (0,1) or (1,0); (1,1) to either (0,1) or (1,0); (0,1) to either (1,1) or (0,0); and (1,0) to either (1,1) or (0,0). These changes occur either in the clockwise, or counter clockwise, direction where one direction corresponds to an increase in wavelength, and the other direction corresponds to a decrease in wavelength. Determination of the direction of increase or decrease is done by experimentation.

In operation, a component of a laser emission, preferably from about 1% to about 10% of the total laser emission, is inputted into the apparatus of the present invention, which may represent power on the magnitude of from about 10 microwatts or more. The inputted laser emission becomes split, at the 3×3 directional coupler, into differing phase shifts. These phase shifts are processed to track the shifts in direction and magnitude of laser emissions, with detection and comparison of the signals which may be recorded. Comparison of the signal occurs with the conversion of the sinusoidal modulation to digital signals. With the conversion to digital signals, the laser emission is preferably varied to determine the direction of the laser emission tracking, i.e., identify the I and Q components. Precision of the present invention preferably ranges from about 0.1 $\mu$m or less for a wavelength change. Preferably, the phase shifts indicate wavelength changes as large digital integers. Processing the detected phase shifts may occur with mechanical, software, or other like manipulation. With the results, the laser emission is calibrated.

In applications where the power of the laser may vary significantly, the R signal can be used as the threshold level. By inputting a threshold level into the means for detecting the power level, small variations of signal irregularity may be overcome. Proper levels of the R signal input may be determined by one of ordinary skill in the art.

Using this defined digital system, a first digital signal is produced to represent a change in state on one hand, with a second digital signal to represent the direction associated with that change. The first and second digital signals can be connected to the clock and direction pins respectively of a large digital counter which will then keep track of the current wavelength change from some initial value when the counter was last cleared. The clock and direction pins may be obtained, for example, as a prepackaged unit such as the LS7166 manufactured by US Digital Corporation of Vancouver, Wash.

EXAMPLE 1

A system as shown in FIG. 1 was constructed (with the exception of no split out of signal) using a guided wave directional coupler, laser, optical detector with two Faraday Rotator Mirrors and a prepackaged unit for the clock and direction pins for the optics and analog circuitry. L was 3 meters. The R signal was not used as the threshold level. The laser wavelength was modulated by driving the piezoelectric tuning connection with a function generator. Sinusoidal, triangular, and square waves were all tested. The I and Q signal were digitized with a 12 bit AD converter at a sampling rate of 2 MHz. The threshold circuitry and the digital logic were then simulated with software. Results are shown in FIGS. 4–7.

Figure 4:
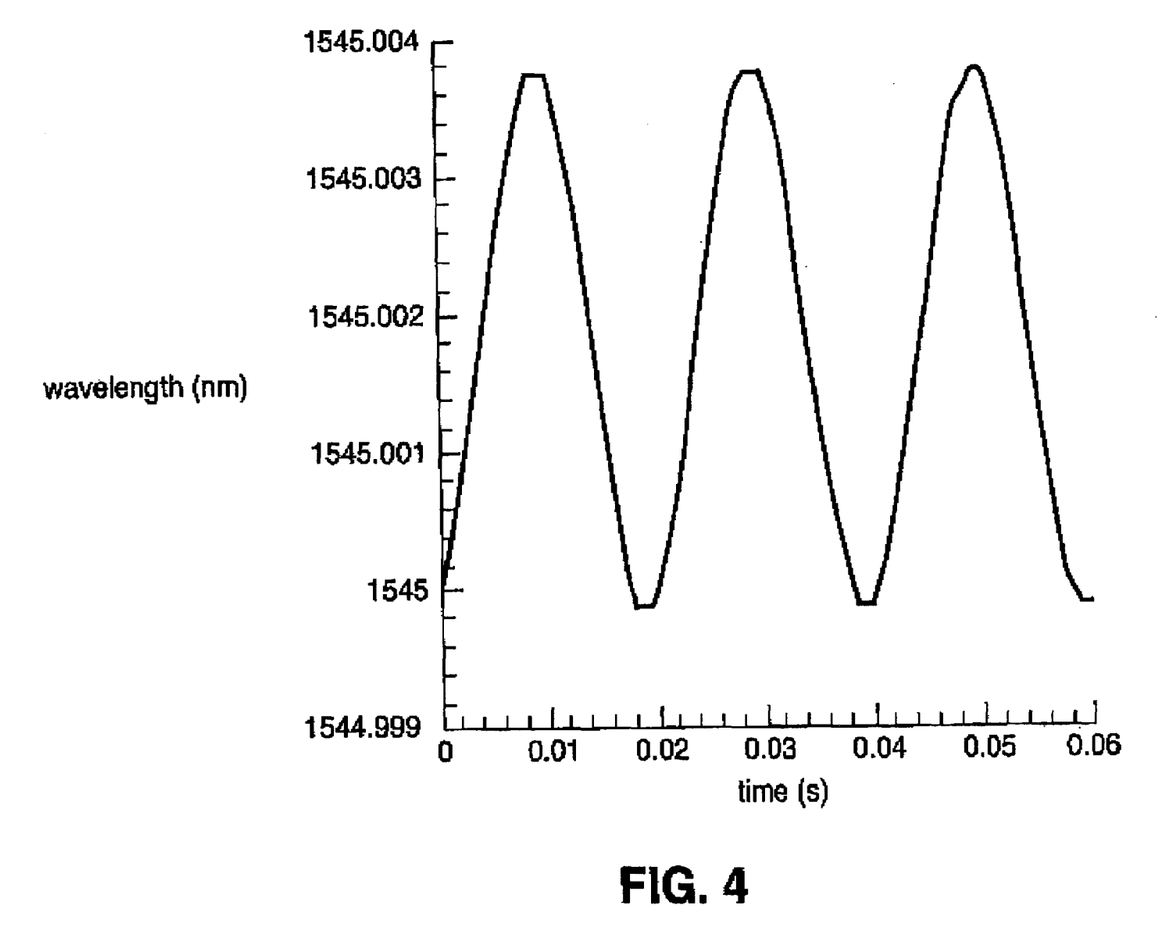
FIG. 4 shows a graphic of wavelength versus time for a sinusoidal modulation for the present invention.
Figure 5:
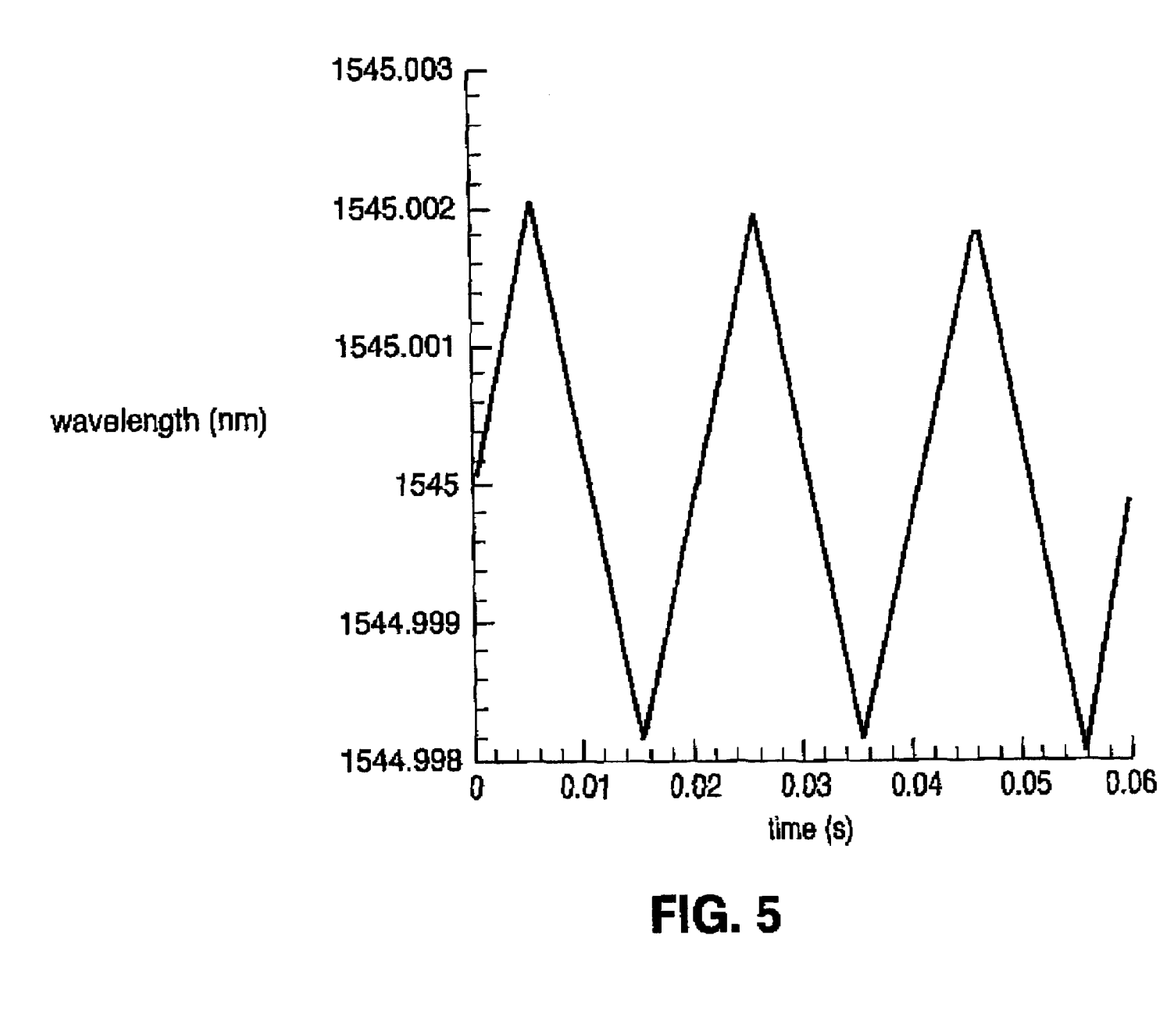
FIG. 5 shows a graphic of wavelength versus time for a triangular modulation for the present invention.
Figure 6:
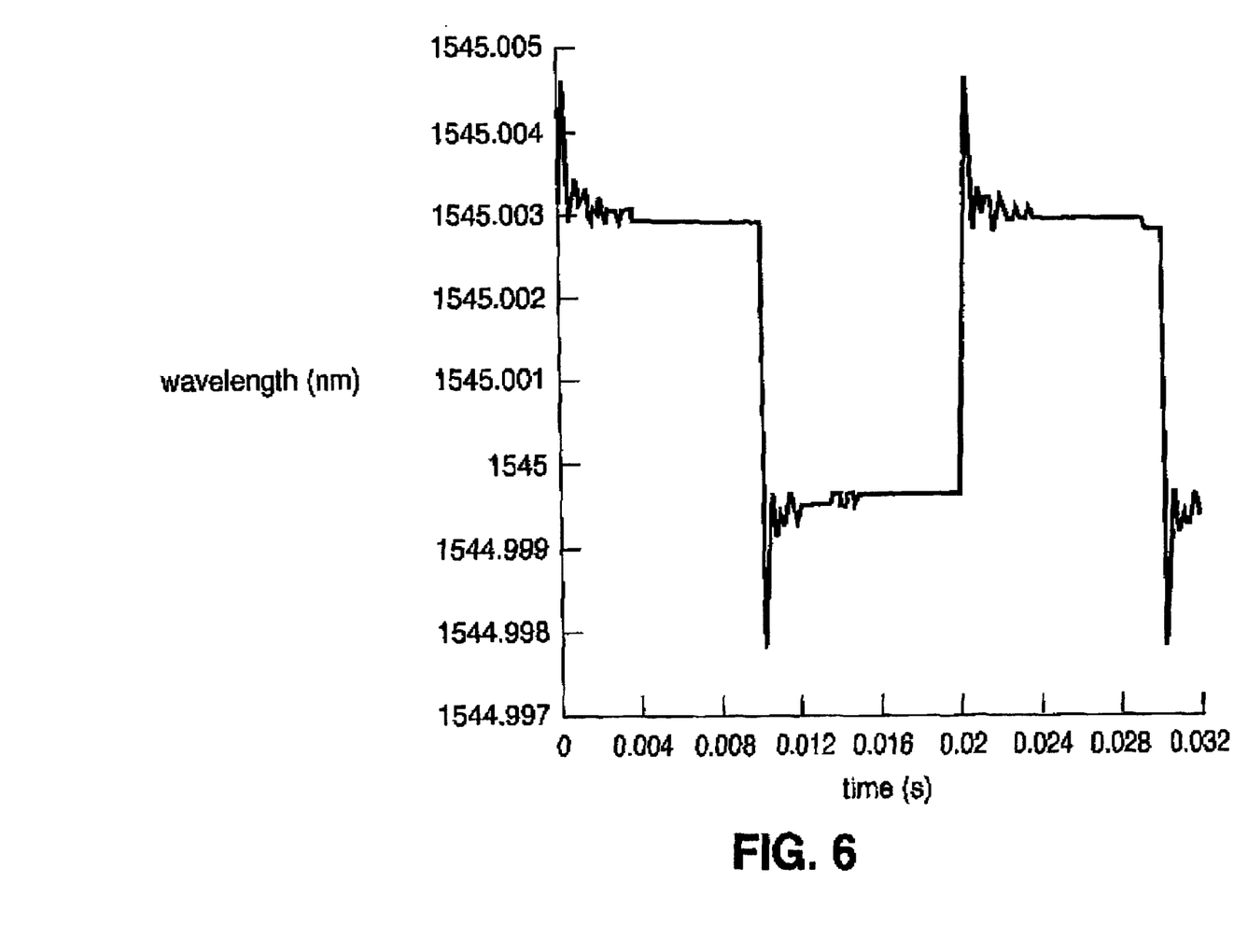
FIG. 6 shows a graphic of wavelength versus time for a squarewave modulation for the present invention; and, FIG. 7 shows a graphic of a step response of the wavelength with PZT control for the present invention.
Figure 7:
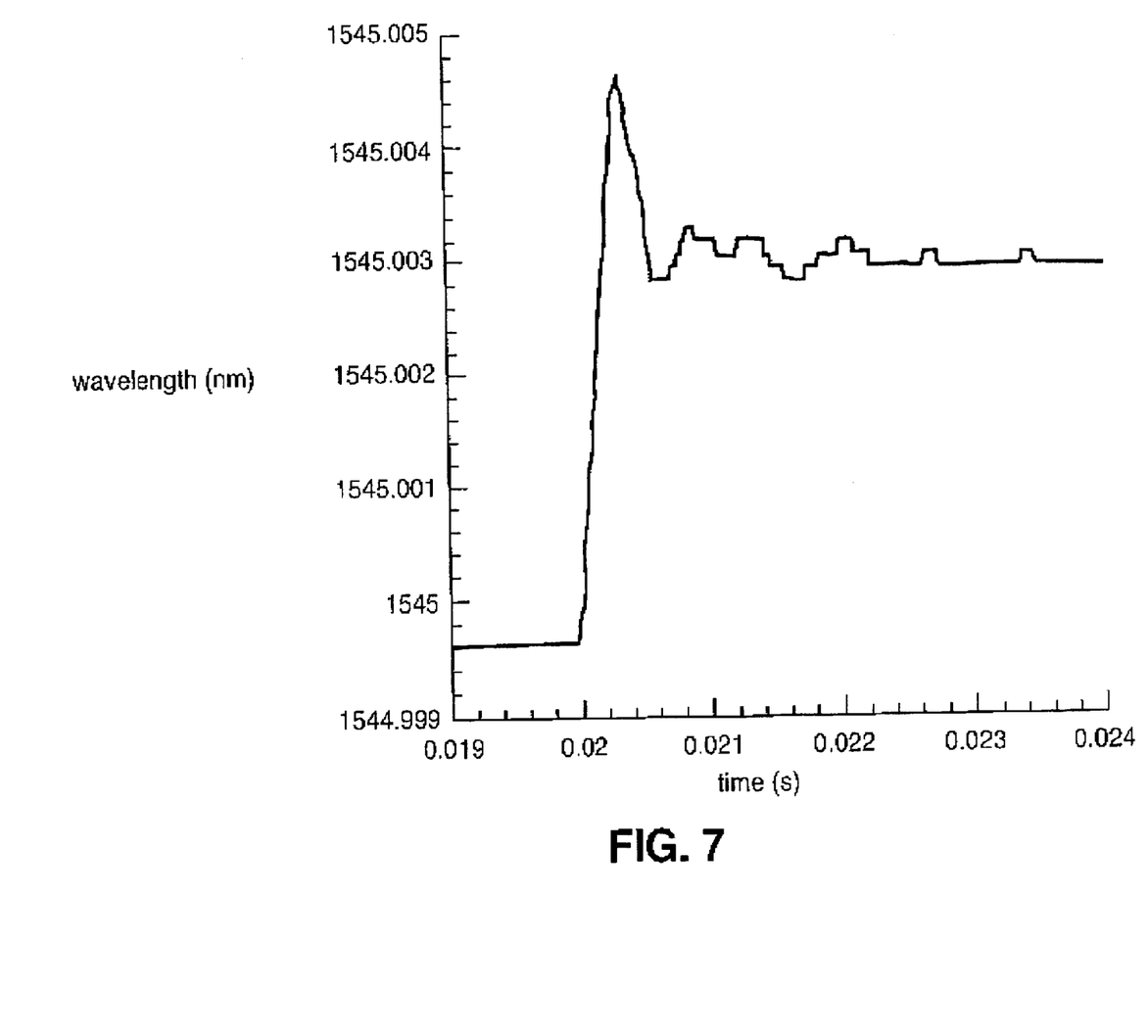

FIG. 4 shows the results of wavelength versus time for a sinusoidal modulation. FIG. 5 shows the results for wavelength versus time for a triangular modulation. FIG. 6 shows the results for a squarewave modulation. The square-wave modulation signal evidences a step-response of the laser-wavelength, and the apparent fidelity of the monitoring system, as shown in FIG. 7 with a step response of the wavelength with PZT control.

The foregoing summary, description, examples and drawings of the present invention are not intended to be limiting, but are only exemplary of the inventive features which are defined in the claims.

What is claimed is:

1. A solid-state apparatus for tracking the wavelength of a laser emission comprising:

a guided wave directional coupler having at least three inputs and three outputs constituting channels, wherein any phase shift induced between the channels is substantially unaffected by changes in the wavelength over the intended range of operation;

means for passing a portion of a laser emission through two substantially different path lengths, wherein the laser emission exiting from the two substantially different path lengths are recombined using the directional coupler;

means for detecting the power level in at least two of the outputs of the directional coupler; and, means for determining the direction and magnitude of laser emission wavelength changes from changes in the at least two detected power levels.

2. The tracking apparatus of claim 1, wherein the directional coupler comprises a 3×3 coupler.

3. The tracking apparatus of claim 1, wherein the directional coupler comprises a 4×4 coupler or higher.

4. The tracking apparatus of claim 1, wherein the apparatus comprises a Michelson interferometer having two Faraday rotator mirrors.

5. The tracking apparatus of claim 1, wherein the means for detecting comprises at least two detectors.

6. A method for tracking laser emissions, comprising the steps of:

providing a solid-state apparatus for tracking the wavelength of a laser emission having a guided wave directional coupler having at least three inputs and three outputs constituting channels, wherein any phase shift induced between the channels is substantially unaffected by changes in the wavelength over the intended range of operation, means for passing a portion of a laser emission through two substantially different path lengths, wherein the laser emission exiting from the two substantially different path lengths are recombined using the directional coupler, means for detecting the power level in at least two of the outputs of the directional coupler and means for determining the direction and magnitude of laser emission wavelength changes from changes in the at least two detected power levels;

initiating a laser emission into the apparatus;

splitting the laser emission into differing phase shifts; and, processing the phase shifts sufficient to track the laser emissions.

7. The method of claim 6, wherein the directional coupler comprises a 3×3 coupler.

8. The method of claim 6, wherein the step of processing the phase shifts comprises recording and comparing the differing phase shifts.

9. The method of claim 6, wherein the step of processing the phase shifts comprises converting to digital signals.

10. The method of claim 6, further comprising the step of varying the laser emission sufficiently to determine the direction of the laser emission tracking.

11. The method of claim 6, wherein the step of initiating a laser emission into the apparatus comprises from about 1 to about 10 percent of a total laser emission.

12. The method of claim 6, wherein the step of initiating a laser emission into the apparatus comprises from about 10 microwatts or more.

13. The method of claim 6, wherein the step of processing the phase shifts provides a wavelength change to a precision of from about 0.1 pm or less.

14. The method of claim 6, wherein the step of processing the phase shifts indicates wavelength changes as large digital integers.

15. The method of claim 6, further comprising the step of inputting a threshold level into the means for detecting the power level.

16. The method of claim 6, wherein the means for processing the detected phase shifts comprises mechanical manipulation.

17. The method of claim 6, wherein the means for processing the detected phase shifts comprises software manipulation.

18. A laser emission calibrated by the method of claim 6.

19. A tracked laser emission product by the process comprising the steps of:

providing a solid-state apparatus for tracking the wavelength of a laser emission having a guided wave directional coupler having at least three inputs and three outputs constituting channels, wherein any phase shift induced between the channels is substantially unaffected by changes in the wavelength over the intended range of operation, means for passing a portion of a laser emission through two substantially different path lengths, wherein the laser emission exiting from the two substantially different path lengths are recombined using the directional coupler, means for detecting the power level in at least two of the outputs of the directional coupler and means for determining the direction and magnitude of laser emission wavelength changes from changes in the at least two detected power levels;

initiating a laser emission into the apparatus;

splitting the laser emission into differing phase shifts;

processing the phase shifts sufficient to track the laser emissions; and, calibrating the laser emission.

20. The product of claim 19, wherein the step of processing the phase shifts comprises converting a received sinusoidal signal into a digital signal.

* * * * *